(12) United States Patent
Arnold

(10) Patent No.: US 8,504,954 B1
(45) Date of Patent: Aug. 6, 2013

(54) METHODOLOGY FOR AUTOMATICALLY GENERATING SERIES-APPROXIMATED COMPONENTS

(75) Inventor: Vaughn T. Arnold, Scotts Valley, CA (US)

(73) Assignee: Apple Inc., Cupertino, CA (US)

( * ) Notice: Subject to any disclaimer, the term of this patent is extended or adjusted under 35 U.S.C. 154(b) by 0 days.

(21) Appl. No.: 13/435,930

(22) Filed: Mar. 30, 2012

(51) Int. Cl.
   *G06F 9/455* (2006.01)

(52) U.S. Cl.
   USPC ........... 716/104; 716/106; 717/151; 717/104; 717/114; 717/135; 327/291

(58) Field of Classification Search
   USPC .............. 716/104, 106; 717/5, 7, 8, 104, 717/114, 135, 151; 327/291
   See application file for complete search history.

(56) References Cited

U.S. PATENT DOCUMENTS

| | | | |
|---|---|---|---|
| 5,197,024 A | 3/1993 | Pickett | |
| 5,224,064 A | 6/1993 | Henry | |
| 6,127,860 A | 10/2000 | Martin et al. | |
| 6,363,405 B1 | 3/2002 | Loginov | |
| 6,581,079 B2 | 6/2003 | Rarick | |
| 6,931,612 B1 * | 8/2005 | Potkonjak et al. | 716/117 |
| 6,981,009 B2 | 12/2005 | Lu | |
| 7,809,782 B1 * | 10/2010 | Foskett et al. | 708/605 |
| 8,099,685 B2 * | 1/2012 | Chew et al. | 716/54 |
| 2003/0037081 A1 | 2/2003 | Vergel | |

OTHER PUBLICATIONS

U.S. Appl. No. 13/435,900, filed Mar. 30, 2012.
Extended Search Report in European Patent Application No. 13160372.2-1953, May 23, 2013, pp. 1-9.
Parhami, Behrooz; "Chapter 24: Arithmetic by Table Lookup" in "Computer Arithmetic: Algorithms and Hardware Designs;" 2000, Oxford University Press, New York, NY, ISBN: 0-19-512583-5; Cover pp. 1-2 and pp. 394-407.
Noetzel, Andrew S.; "An Interpolating Memory Unit for Function Evaluation: Analysis and Design;" IEEE Transactions on Computers, vol. 38, No. 3, Mar. 1989; pp. 377-384.

* cited by examiner

*Primary Examiner* — Jack Chiang
*Assistant Examiner* — Brian Ngo
(74) *Attorney, Agent, or Firm* — Lawrence J. Merkel; Meyertons, Hood, Kivlin, Kowert & Goetzel, P.C.

(57) ABSTRACT

In an embodiment, hardware implementing a transcendental or other non-linear function is based on a series expansion of the function. For example, a Taylor series expansion may be used as the basis. One or more of the initial terms of the Taylor series may be used, and may be implemented in hardware. In some embodiments, modifications to the Taylor series expansion may be used to increase the accuracy of the result. In one embodiment, a variety of bit widths for the function operands may be acceptable for use in a given implementation. A methodology for building a library of series-approximated components for use in integrated circuit design is provided which synthesizes the acceptable implementations and tests the results for accuracy. A smallest (area-wise) implementation which produces a desired level of accuracy may be selected as the library element.

19 Claims, 15 Drawing Sheets

$$f(x) = f(a) + (x-a)\frac{f'(a)}{1!} + (x-a)^2\frac{f''(a)}{2!} + \ldots$$

| x | 1 | a6 | a5 | a4 | a3 | a2 | a1 | a0 | s | d6 | d5 | d4 | d3 | d2 | d1 | d0 |

| a | 1 | a6 | a5 | a4 | a3 | a2 | a1 | a0 | 1 | 0 | 0 | 0 | 0 | 0 | 0 | 0 |

If s=1, x-a =

| 0 | d6 | d5 | d4 | d3 | d2 | d1 | d0 |

If s=0, x-a = one's complement of above

Fig. 5

METHODOLOGY FOR AUTOMATICALLY GENERATING SERIES-APPROXIMATED COMPONENTS

BACKGROUND

1. Field of the Invention

This invention is related to the field of integrated circuits and, more particularly, to implementing transcendental and certain non-linear functions in integrated circuits.

2. Description of the Related Art

There is a class of mathematical functions that are referred to as "transcendental" functions. Transcendental functions are functions that cannot be expressed in a finite sequence of algebraic operations. Examples include exponential functions, logarithmic functions, and trigonometric functions.

Transcendental functions have a variety of uses in integrated circuits. For example, various transcendental functions are often used in the manipulation of video values such as pixels. Gamma/Degamma operations include transcendental functions, for example. Accordingly, it is necessary to implement transcendental functions in integrated circuits.

Because the transcendental functions do not have a finite algebraic representation, the functions cannot be implemented directly in hardware. One technique to approximate a transcendental function uses a lookup table (LUT) that stores results for a given transcendental function at various preselected points. Two points nearest an input operand to the function are read from the LUT, and linear interpolation between the two points is used to approximate an answer for the input operand. To achieve an acceptable level of accuracy, the LUTs must be made very large. Certain other non-linear functions may similarly require large LUTs to provide an acceptable level of accuracy (e.g. the reciprocal function 1/x, square root, etc.).

SUMMARY

In an embodiment, hardware implementing a transcendental function or other non-linear is based on a series expansion of the function. For example, a Taylor series expansion may be used as the basis. One or more of the initial terms of the Taylor series may be used, and may be implemented in hardware. In some embodiments, modifications to the Taylor series expansion may be used to increase the accuracy of the result.

In one embodiment, a variety of bit widths for the function operands may be acceptable for use in a given implementation. A methodology for building a library of series-approximated components for use in integrated circuit design is provided which synthesizes the acceptable implementations and tests the results for accuracy. A smallest (area-wise) implementation which produces a desired level of accuracy may be selected as the library element.

BRIEF DESCRIPTION OF THE DRAWINGS

The following detailed description makes reference to the accompanying drawings, which are now briefly described.

FIG. 5 is a block diagram illustrating generation of an x–a term for a Taylor series expansion for one embodiment.

Figure 1:
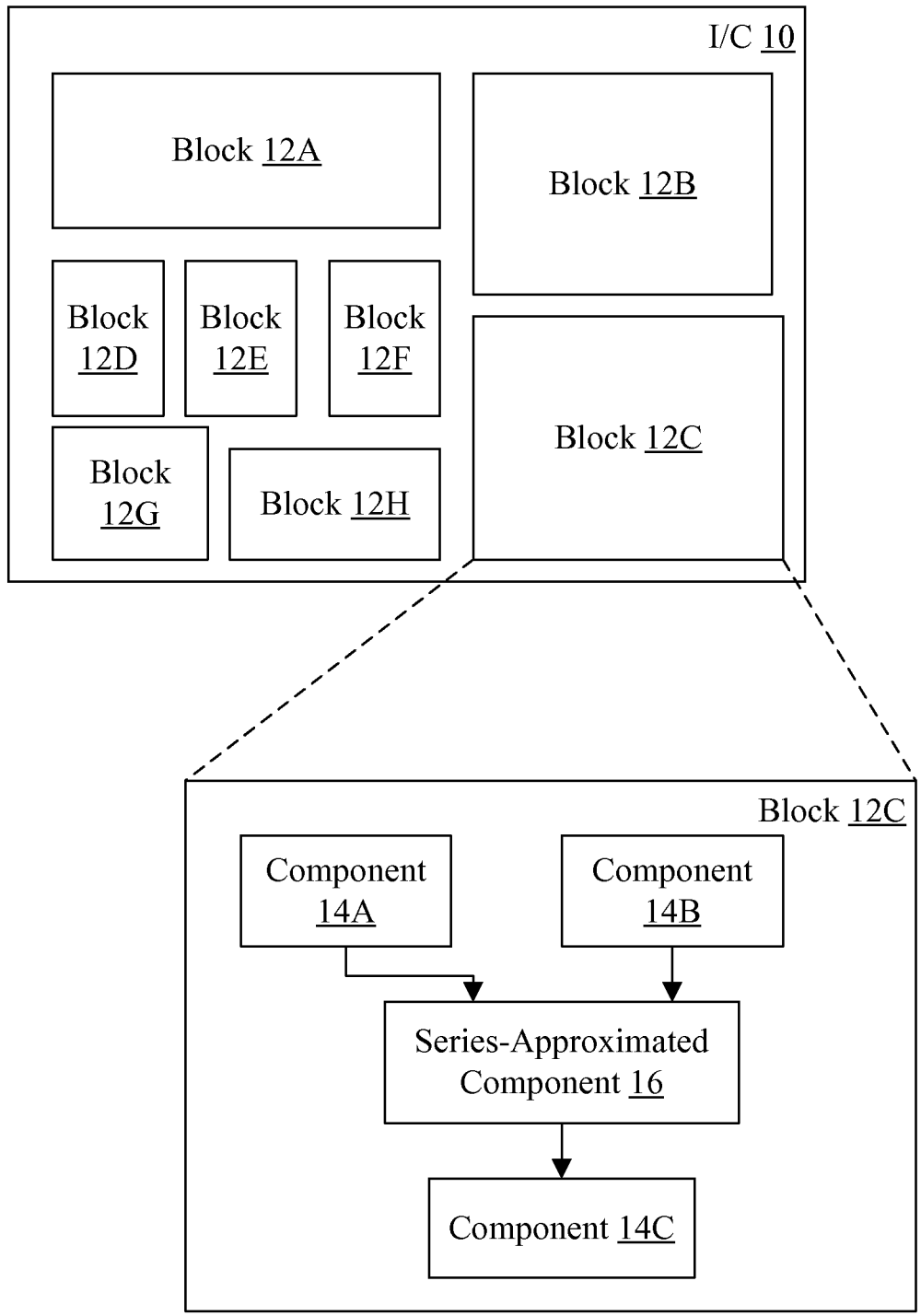
FIG. 1 is a block diagram of one embodiment of an integrated circuit.

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims. The headings used herein are for organizational purposes only and are not meant to be used to limit the scope of the description. As used throughout this application, the word "may" is used in a permissive sense (i.e., meaning having the potential to), rather than the mandatory sense (i.e., meaning must). Similarly, the words "include", "including", and "includes" mean including, but not limited to.

Various units, circuits, or other components may be described as "configured to" perform a task or tasks. In such contexts, "configured to" is a broad recitation of structure generally meaning "having circuitry that" performs the task or tasks during operation. As such, the unit/circuit/component can be configured to perform the task even when the unit/circuit/component is not currently on. In general, the circuitry that forms the structure corresponding to "configured to" may include hardware circuits and/or memory storing program instructions executable to implement the operation. The memory can include volatile memory such as static or dynamic random access memory and/or nonvolatile memory such as optical or magnetic disk storage, flash memory, programmable read-only memories, etc. Similarly, various units/circuits/components may be described as performing a task or tasks, for convenience in the description. Such descriptions should be interpreted as including the phrase "configured to." Reciting a unit/circuit/component that is configured to perform one or more tasks is expressly intended not to invoke 35 U.S.C. §112, paragraph six interpretation for that unit/circuit/component.

DETAILED DESCRIPTION OF EMBODIMENTS

Turning now to FIG. 1, a block diagram of an integrated circuit 10 is shown. In the illustrated embodiment, the integrated circuit 10 includes multiple blocks 12A-12H. Block 12C is shown in exploded view, and includes a variety of components 14A-14C and a series-approximated component 16. In various embodiments, a block may include more than one series-approximated component 16, and more than one block may include series-approximated components.

The blocks 12A-12H may be configured to perform the various operations that the integrated circuit 10 is designed for. The blocks 12A-12H may be determined by partitioning the design into logical subsections based on the definition of the integrated circuit 10. For example, the integrated circuit 10 may be a system on a chip (SoC). The blocks 12A-12H may include processors, peripherals, communication fabric circuits, memory controllers, etc. Blocks may have multiple levels of hierarchy (i.e. blocks may contain other blocks). For example, a processor block may include blocks for fetch and decode, caches, instruction issue, execution units, etc. Blocks may include components in addition to other blocks, or may include only components if the blocks are the lowest level in the hierarchy. While not shown in FIG. 1, the blocks 12A-12H may generally be interconnected as needed to implement the overall operation of the integrated circuit 10.

The components 14A-14C of the block may be various circuit elements. For example, components may be instantiations of data flow circuitry such as adders, multipliers, multiplexors, shifters, rotators, registers, memory, etc. The components 14A-14C may also be logic circuitry corresponding to expressions written in a register-transfer level (RTL) description of the block. Generally, an RTL description may be written in a hardware design language such as Verilog or VHDL, and may describe the logic circuitry in terms of registered state and logical operations on that state. The registered state may be stored in any clocked storage devices (e.g. registers, latches, flip-flops, etc.). A synthesis tool may be used to read the RTL description and generate logic circuitry corresponding to the RTL description for implementation in the integrated circuit 10. In other cases, custom circuitry may be developed by a designer and may be captured via schematic capture tools. The custom circuitry may also be a component 14A-14C.

The series-approximated component 16 may be a component that implements a transcendental function or other non-linear function. Not all non-linear functions are implemented as series-approximated components, but some such functions may benefit from a series-approximated implementation (e.g. the reciprocal function 1/x, square root, etc.). More particularly, in an embodiment, the transcendental/non-linear function may be implemented by circuitry derived from a series expansion of the transcendental/non-linear function. The circuitry may be derived from selected terms of the expansion, and/or may be modified from the original terms of the series expansion. Various embodiments are discussed in more detail below. In some cases in the discussion below, a transcendental function may be used as an example, but generally the series expansion approximation may be used for any non-linear function. In other cases, a non-linear function such as the reciprocal is used as an example. Thus, a series-approximated component may generally be a component that approximates a transcendental or non-linear function using terms of a series expansion representation of the function, or terms modified from (e.g. optimized for reduced error from) the series expansion terms. The approximated function may be referred to as a series-approximated function.

The components 14A-14C and 16 may be coupled together to realize the operation of the block 12C. Thus, non-series-approximated components may generate inputs to the series-approximated components, and vice versa. Additionally, inputs from other blocks and outputs to other blocks may be generated by both transcendental and non-series-approximated components.

Figure 2:
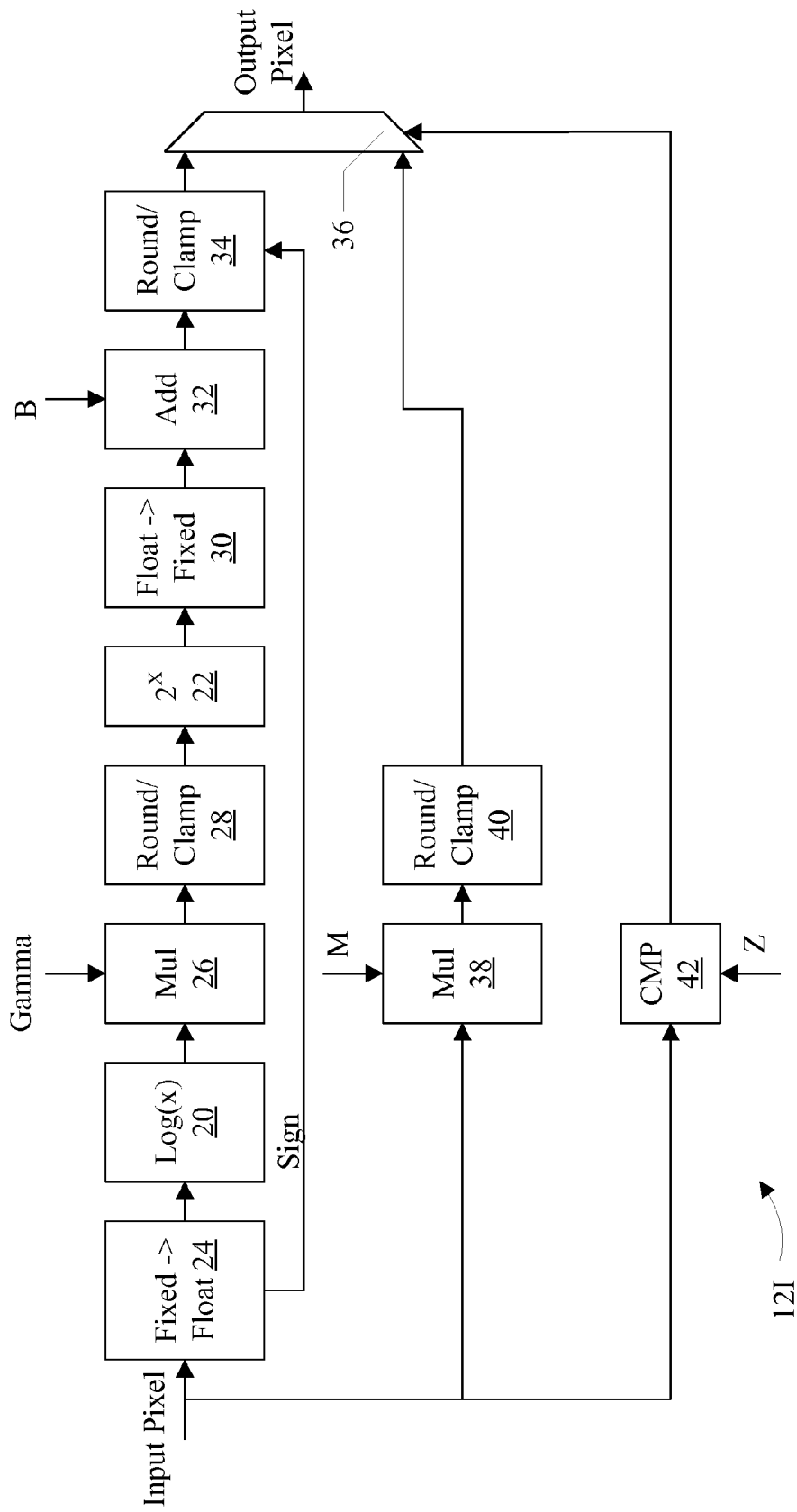
FIG. 2 is a block diagram of one embodiment of a block that includes series-approximated components.

FIG. 2 is a more specific example of a block 12I which may be implemented in one embodiment. The embodiment of FIG. 2 may be a gamma/degamma correction block which performs gamma/degamma correction on pixel values. Gamma correction is a non-linear operation applied to pixel values to compensate for human vision properties, in order to improve the use of pixel bits relative to how humans perceive light and color. Gamma correction generates the output pixel value by raising the input pixel value to a power (generally referred to as the greek letter "gamma," hence the function name) which is typically between 0 and 1 for gamma correction and is greater than 1 for degamma operation. The portion of the gamma function near zero (in pixel value) is somewhat linear, and becomes increasingly non-linear as the pixel value increases.

The series-approximated components in the embodiment of FIG. 2 may include the log(x) component 20 and the $2^X$ component 22. The log(x) component 20 may implement a log base 2, or $\log_2$. The $2^X$ component 22 may also be referred to as the antilog component, since raising two to the power of x is the inverse of the $\log_2$ of x. It is noted, however, that any base could be used in other embodiments, as long as the base for both the log and antilog functions match. One implementation of another base may use the base 2 log and antilog functions, and may multiply the value of x by $\log_2(\text{base})$ to arrive at the correct answer. For example, a base of e is desired in some implementations and may be implemented with a $\log_2(e)$ term.

In the illustrated embodiment, the input pixel value is an integer and the series-approximated components operate on floating point values. Accordingly, a fixed to float conversion component 24 is included to convert the pixel value.

As mentioned above, gamma correction is performed by raising the pixel value to the power gamma. By taking the log of the pixel value, the "raise to the power" computation becomes a multiplication. Accordingly, the output of the log (x) component 20 may be multiplied by the input gamma value in a multiplier component 26. The result may be rounded and clamped to a maximum value to prevent overflow (round/clamp component 28). The result is provided to the $2^X$ component 22. By taking the antilog of the product from the multiplier 26, the input pixel raised to the value gamma may be generated. The result may be converted from floating point back to fixed point (float to fixed conversion component 30). In this embodiment, an offset (B) is added to the gamma-corrected pixel, and the adder component 32 may be provided to add the offset. Other embodiments may not add an offset and may eliminate the adder component 32. The result may be rounded and clamped (component 34) and provided to a multiplexor component 36.

It is noted that $2^{-X}$ and $2^X$ functions may be separate implementations, because the Taylor series values for the functions may differ. In some embodiments, a $2^{-X}$ function may be implemented, and $2^X$ may be implemented using $2^{-X}$. For example, $2^X$ is mathematically equal to the product of $2^1$, $2^X$, and $2^{-1}$. Multiplying $2^X$ and $2^{-1}$ is equal to $2^{X-1}$, which can also be written as $2^{-(1-X)}$ by factoring out a $-1$ in the exponent. Accordingly, $2^X$ is also mathematically equal to $2^1$ multiplied by $2^{-(1-X)}$. By using the $2^{-X}$ function with $1-X$ as the input, and multiplying the result by $2(2^1)$, the $2^X$ function may be realized. Multiplying by two may be implemented as a shift. Other powers of two may be used as well, if desired.

In this embodiment, a portion of the input pixel range is approximated by a linear operation. The linear path is shown as the multiplier component 38 and round/clamp component 40. The multiplier component 38 may be configured to multiply the input pixel value by a factor M, which may rounded/clamped by the round/clamp component 40. The result is the other input to the multiplexor component 36 in this embodiment. A comparator component 42 may compare the pixel value to the threshold for using the linear path. The threshold is shown as a value Z input to the comparator component 42. If the pixel value is less than or equal to Z, the linear path may be selected through the multiplexor component 36. Otherwise, the nonlinear path (including the components 20-34) may be selected through the multiplexor component 36. Other embodiments may not implement the linear path, instead using the non-linear path for the full function range. In such an embodiment, elements 36, 38, 40, and 42 may be eliminated.

As mentioned previously, some embodiments of the series-approximated components may be implemented using hardware derived from an infinite series expansion of the series-approximated function corresponding to the component. The infinite series expansion coverts the non-algebraic transcendental function or non-linear function into algebra. A reasonably precise approximation of the transcendental/non-linear function may be obtained by implementing the initial few terms of the infinite series. Additionally, in some embodiments, error properties of the series-approximated components may be improved by modifying the initial series expansion implementation, as will be discussed in more detail below.

Figures 3, 4:
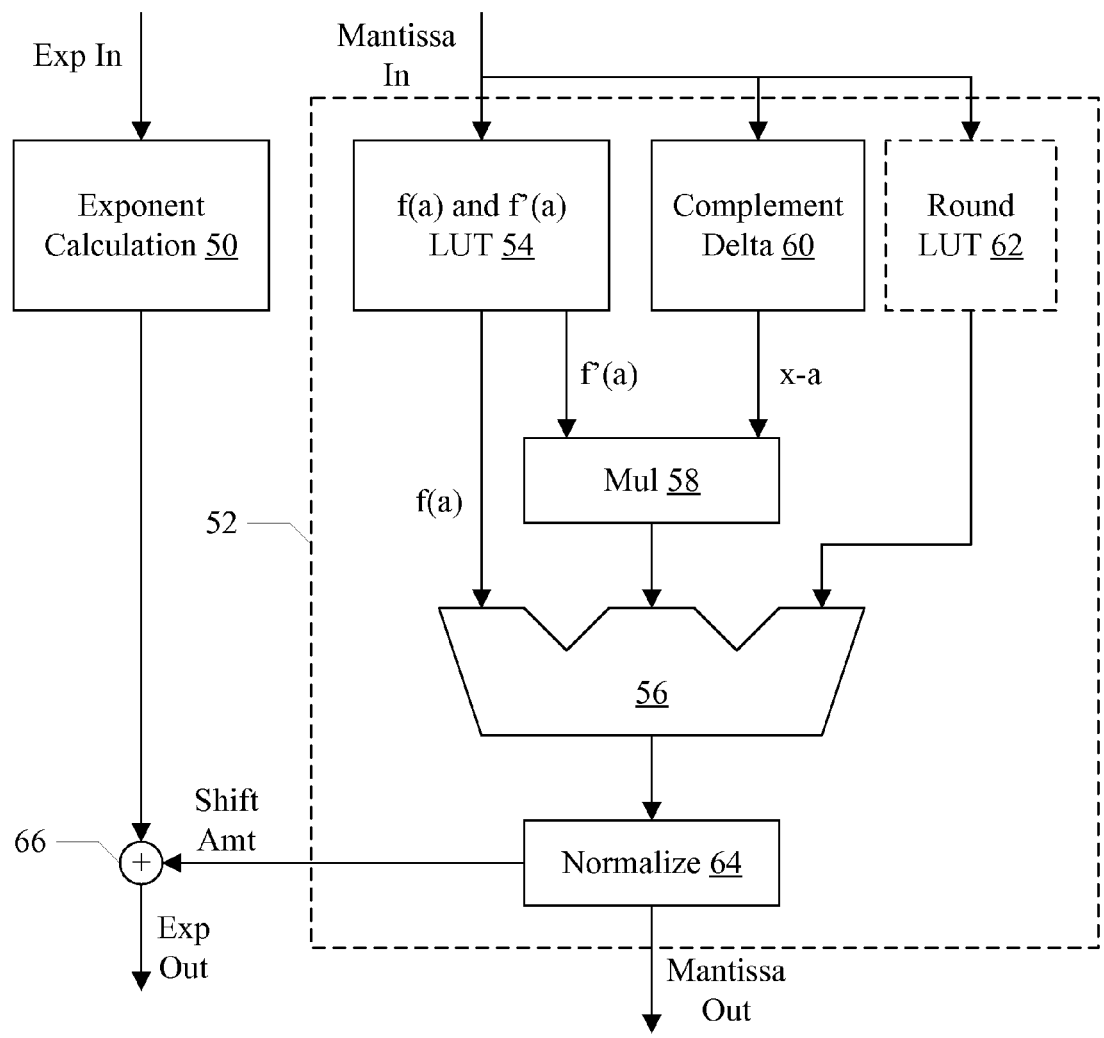
FIG. 3 is a formula illustrating a Taylor series expansion.
FIG. 4 is a block diagram of one embodiment of a transcendental or other non-linear component implemented based on an initial two terms of a Taylor series expansion.

In one embodiment, a Taylor series expansion is used as the basis for the series-approximated components. The formula for the Taylor series expansion is shown in FIG. 3. Generally, the Taylor series expansion (or more briefly, "Taylor series") involves the value of the function and an infinite number of its derivatives at a preselected point ("a" in FIG. 3). More than one preselected point may be used, in which case the preselected point that is nearest a given input value may be selected and it's function and derivative values may be used for that given input value. The set of input values for which a given preselected point is used may be referred to as an "interval," and the given preselected point may be referred to as corresponding to the interval. If only one preselected point is used, the interval may be the entire range of x.

Generally, the value of the function for input x ("f(x)" in FIG. 3) is the sum of the value of the function at a ("f(a)") and products including each derivative at a ("f'(a)", "f''(a)", etc.) and the difference between x and a. More particularly, each derivative at a may be divided by a factorial corresponding to the order of the derivative (e.g. the first derivative is divided by one factorial, the second derivative is divided by two factorial, the third derivative is divided by three factorial, etc.). The result may then be multiplied by the difference between x and a raised to the power of the order of the derivative ("x−a" for the first derivative, "(x−a)$^2$" for the second derivative, "(x−a)$^3$" for the third derivative, etc.).

If the series-approximated component is implemented with floating point operands, the mantissa of a normal number is known to between exactly one and almost two. If a is selected somewhere near the middle of the mantissa range, then the range of x−a is about negative 0.5 to positive 0.5. Each additional power to which the x−a term is raised leads to a smaller and smaller number, reducing the effects of the corresponding terms in the Taylor series. When more than one value of a is used over the mantissa range, the reduced effects of the higher order derivatives may be even more pronounced. Accordingly, a floating point implementation of the Taylor series for transcendental/non-linear functions is used as an example below. The Taylor series may be used for the mantissa generation, and exponent generation may be handled in parallel.

FIG. 4 is a block diagram illustrating one embodiment of a series-approximated component 16 based on a floating point implementation of the Taylor series. The embodiment in FIG. 4 implements the initial two terms of the Taylor series (f(a) and it's first derivative f'(a)). The series-approximated component 16 may include an exponent calculation unit 50 and a mantissa calculation unit 52. The exponent calculation unit 50 is coupled to receive the exponent portion of the input value and is configured to generate the output exponent. The output exponent may be adjusted if the output mantissa needs normalization.

In the illustrated embodiment, the mantissa calculation unit 52 includes a lookup table (LUT) of f(a) and f'(a) values for each selected a in the implementation (reference numeral 54). The number of preselected points ("a"s) in the table may vary from embodiment to embodiment. Each preselected point may be associated with an interval of mantissa values. Accordingly, the most significant bits (MSBs) of the mantissa may define which interval includes the input mantissa, and these MSBs may serve as an input to the LUT 54. The LUT 54 may be configured to output the value of f(a) and f'(a) from the entry selected responsive to the MSBs of the input mantissa.

The f(a) output from the LUT 54 may be coupled as an input to an adder 56, and the f'(a) output may coupled as an input to a multiplier 58. The adder 56 and multiplier 58 may collectively be referred to as multiply-add circuitry or a multiply-add unit. The output of the multiplier 58 may be coupled as an input to the adder 56. The multiplier 58 may be coupled to receive the f'(a) value from the LUT 54 as well as the x−a term based on the input mantissa and a.

More particularly, in one embodiment, if a is selected as the center of the interval, then x−a may be calculated as shown in FIG. 5. FIG. 5 illustrates the mantissa portion of x (the input value) and the value of a that corresponds to x (i.e. the value of a for the interval that contains x). Both mantissas begin with the implied 1 that is to the left of the binary point. Additionally, both mantissas have the same set of MSB mantissa bits that define the interval. These bits are illustrated in FIG. 5 as address bits a6:a0, since the bits may also be used as the address bits to the LUT 54. The MSB after the address bits is shown as a sign bit ("s") in the value of x in FIG. 5. This sign bit may be referred to as the interval sign bit. If the s bit is one, the value of x is greater than or equal to a and the x−a value is positive. If the s bit is zero, the value of x is less than a and the x−a value is negative.

As FIG. 5 illustrates, if a is selected at the center of the interval, the least significant bits of a (below the interval sign bit) are zero. Thus, the value of x−a if x is greater than a is simply the least significant bits of x (e.g. d6:d0 in FIG. 5). If the value of x−a is negative, x−a is the one's complement of the least significant bits of x.

For an embodiment based on FIG. 5, the complement delta circuit 60 may be configured to generate the value of x−a. If x−a is positive (the interval sign bit is a 1), the complement delta circuit 60 may be configured to pass the least significant bits of x as x−a. If x−a is negative, the complement delta circuit 60 may be configured to transmit the one's complement of the least significant bits of x as x−a. More generally, in other embodiments, the complement delta circuit 60 may be replaced by an adder configured to subtract a from x. The output of the complement delta circuit 60 may be coupled as an input to the multiplier 58.

The embodiment of FIG. 4 may optionally include a round LUT 62. The LUT 54 and multiply-add circuitry 56/58 produces an approximation of the transcendental/non-linear function for each input value x. Thus, there may be some inaccuracy in at least some results. More particularly, the results may not meet the accuracy requirements of floating point standards, such as the Institute for Electrical and Electronic Engineers (IEEE) standard 754 and follow-ons. The IEEE standard requires results to be accurate to within +/−½ unit in the last place (ULP) as compared to the completely precise result, and also that the rounding be "statistically unbiased" (i.e. half of the ties for rounding are rounded up and the other half rounded down). In one embodiment, the series-approximated component 16 may produce results that are accurate within one full ULP without including the round LUT 62. The round LUT 62 may be programmed to perform the correct rounding, including meeting the statistically unbiased requirement.

In some cases, results that do not meet IEEE standard accuracy may be acceptable. For example, the series-approximated functions may be used in graphics operations, and some amount of inaccuracy may be acceptable because the visual image may still be quite accurate and visual pleasing. However, if more accurate results are desired, the round LUT 62 may be included. The round LUT 62 may include a rounding value for each input mantissa value that does not produce an IEEE accurate result, and may produce a rounding factor that rounds the result to an IEEE accurate result. In one embodiment, the LUT 62 may be two tables: one listing input mantissas that produce a result that is one ULP low and the other listing input mantissas that produce a result that is one ULP high (compared to the IEEE correct result). The tables may produce a one if the input mantissa is found in the table, and the outputs may be used to control a mux that selects a round of −1 (one ULP high), +1 (one ULP low), or default zero if neither table contains the input mantissa.

In one embodiment described in more detail below, an executable model may be generated for the series-approximated component 16. The executable model may be expressed in a high-level programming language such as C, C++, etc. The executable model may be compiled into executable binary code and executed on a processor in a computer. Alternatively, the executable model may be expressed in the executable binary code or low level processor instructions. Still further, the RTL description of the series-approximated component 16 may be simulated as an executable model. The executable model may be executed for each possible input mantissa, and the rounding value that rounds the result to within +/−½ ULP may be recorded to populate the round LUT 62. The output of the round LUT 62 may be coupled as an input to the adder 56, and the adder output may be an IEEE correct result. In embodiments that do not include the round LUT 62, the adder 56 may be a two input adder.

It is possible that the result will not be a normal floating point number (i.e. the mantissa is not a single binary one to the left of the binary point and the remaining digits to the right of the binary point). The normalize circuit 64 may be provided to normalize the mantissa. An adder 66 may be configured to adjust the exponent generated by the exponent calculation unit 50 by adding a shift amount applied by the normalize circuit 64.

Mantissa widths may be selected as desired to provide a desired level of accuracy in the result from the series-approximated function (or from the overall function in which the series-approximated function is a component). For example, if the values being operated upon are pixels, a mantissa width somewhat greater than the desired color depth may be acceptable. Generally, the wider the mantissa, the more accurate the result from the series-approximated function may be compared to the precise result (because errors occur in the LSBs of the result). However, wider mantissas also generally lead to a wider multiplier 58 and adder 56. Particularly for the multiplier 58, the increased width may lead to increased area in the realization of the series-approximated component 16 in the integrated circuit 10. If a narrower mantissa is used for a given implementation, more intervals may need to be defined to reduce the maximum errors. More intervals may increase the size of the LUT 54, but the narrower mantissa may lead to reduced-size multiplier 58/adder 56. A variety of design variations may thus be possible that meet the accuracy target for the series-approximated component 16. In one embodiment, a methodology for automatically selecting parameters for a series-approximated component 16 may be used. Additional details regarding the methodology are provided below.

Figure 6:
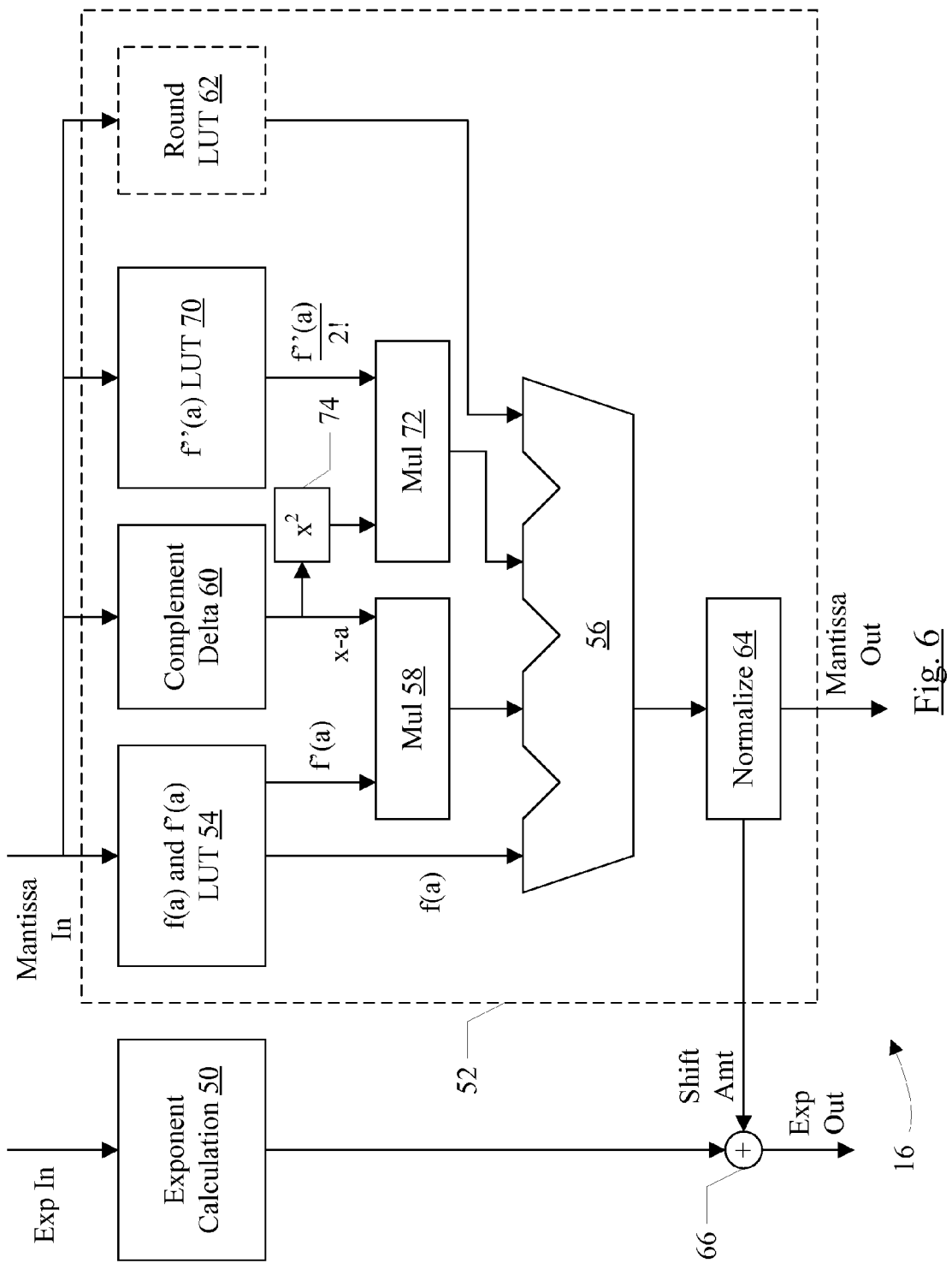
FIG. 6 is a block diagram of one embodiment of a transcendental or other non-linear component implemented based on an initial three terms of a Taylor series expansion.

FIG. 6 is a block diagram of another embodiment of the series-approximated component 16. The embodiment of FIG. 6 may implement the initial three terms of the Taylor series (corresponding to f(a), f'(a), and f"(a)). Similar to the embodiment of FIG. 4, the embodiment of FIG. 6 may implement the exponent calculation unit 50, the mantissa calculation unit 52, and the adder 66 to adjust the exponent for normalization. The mantissa calculation unit 52 may include the LUT 54, the multiplier 58, the adder 56 (with three or four inputs, rather than two or three inputs), the normalize circuit 64, the complement delta circuit 60, and optionally the round LUT 62 coupled in a similar fashion to the embodiment of FIG. 4.

Additionally, the embodiment of FIG. 6 may include a f"(a) LUT 70, a multiplier 72, and a squaring circuit 74. The squaring circuit 74 may be coupled to receive the x−a term and may be configured to square it, producing the $(x-a)^2$ term as an input to the multiplier 72. Generally, the squaring circuit 74 may be a multiplier. However, the multiplier may simplify from a full general purpose multiplier such as the multipliers 58 and 72, because it is known that the same value is input as both operands of the multiplier.

The other input of the multiplier 72 may be the f"(a) term from the LUT 70. Similar to the LUT 54, the LUT 70 may be indexed by the MSBs of the mantissa. The LUT 70 may have the same number of entries as the LUT 54, and may be physically included in the same table if desired. The output of the LUT 70 may be the f"(a) term divided by two factorial (or simply 2) to match the third term of the Taylor series as shown in FIG. 3. Accordingly, the output of the multiplier 72 may be the third term of the Taylor series.

It is noted that the embodiments of the series-approximated component 16 shown in FIGS. 4 and 6 are logical representations of the component 16. An RTL description of the component 16 describing the embodiments as shown may be generated, and may be synthesized using a synthesis tool to produce an actual implementation. The synthesis tool may produce any Boolean equivalent of the logical design, in various embodiments.

A variety of series-approximated functions may be supported in various embodiments. For example, an embodiment may support one or more of: log(x), antilog(x) (or $2^x$), 1/x, reciprocal square root, square root, and $2^{-x}$. Other embodiments may support any subset of the above functions and other functions, or all of the above functions and other functions, as desired.

For each supported function, the LUT tables 54 and 70 may be developed to calculate the mantissa based on Taylor series approximations. The exponent may be calculated directly by the exponent calculation unit 50. For example, for 1/x, the exponent is the negative of the input exponent minus one, except for the case of a mantissa of exactly 1.0, in which case the exponent is the negative of the input exponent (i.e. no minus one factor). Reciprocal square root has an exponent that is the negative of the input exponent divided by two, minus one (or no minus one factor if the mantissa is exactly 1.0).

Turning next to FIGS. 7-14, various embodiments of series-approximated component 16 are illustrated in graphical form for embodiments derived from the Taylor series. The function 1/x is used as an example. In each figure, the horizontal axis is the mantissa portion of the x input to the function, and the vertical axis is the value of f(x). The function is shown as a solid curve 80. The corresponding result from the component 16 is shown as a dashed line or lines in each figure.

Figure 7:
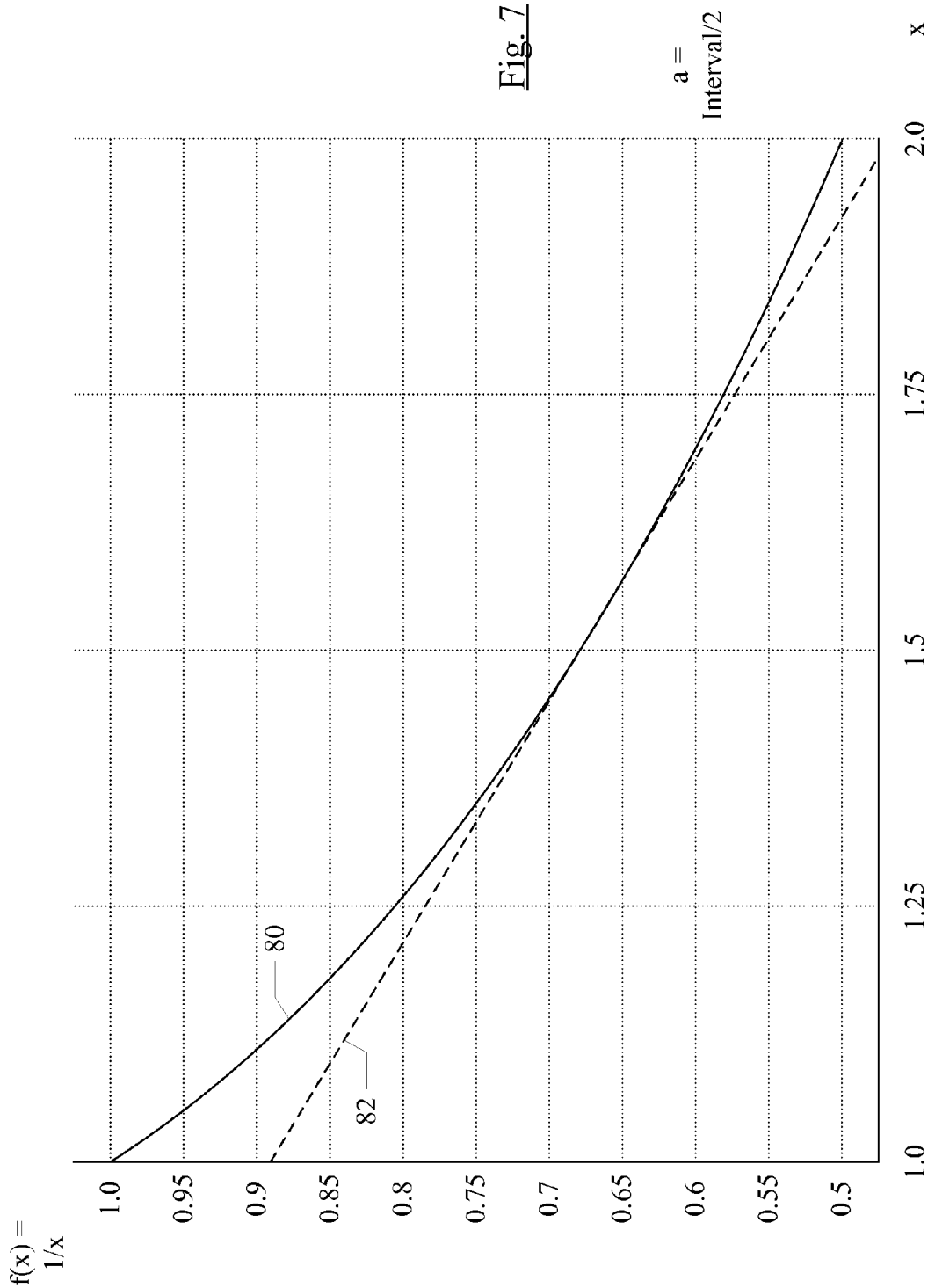
FIG. 7 is a diagram of one embodiment of a Taylor series expansion about a point in a center of an interval.
Figure 8:
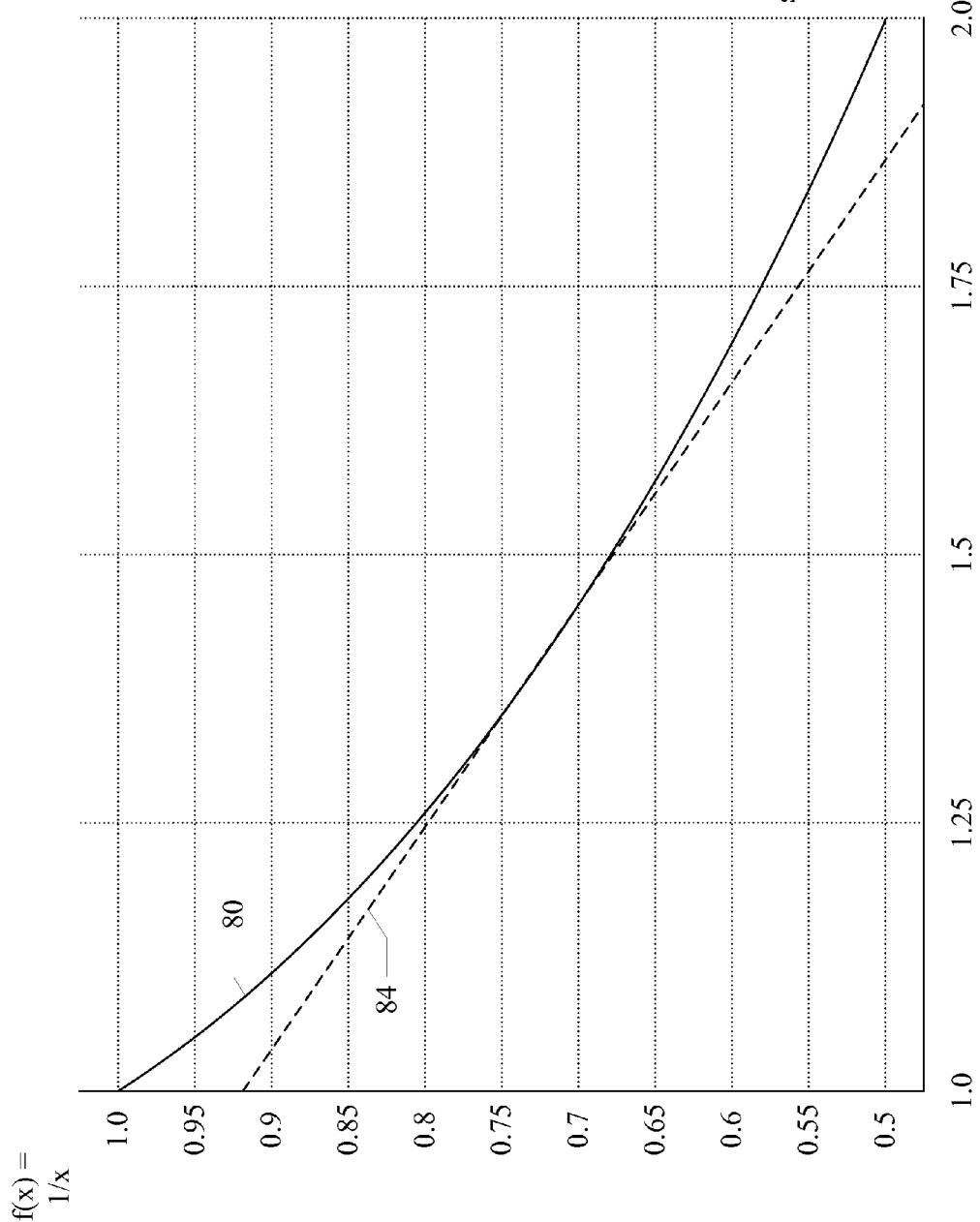
FIG. 8 is a diagram of one embodiment of a Taylor series expansion about a point selected to provide an equal error at each boundary of the interval.

Turning now to FIG. 7, a diagram illustrating a Taylor series using the initial two terms of the series and a single interval for the mantissa is shown. In this example, a is selected as the midpoint of the interval (interval/2). Since one interval is shown in this example, a is 1.5. A dashed line 82 illustrates the result of the two term Taylor series for this function. As can be seen in the diagram, the error is smallest at a (error of zero), and increases as the distance from a increases. Including more intervals may reduce the error.

The maximum error in this example is at the end points of the intervals (e.g. mantissas of 1.0 and almost 2.0, for the one interval case). For many functions, the error may be greater at one end of the interval than the other, and thus the maximum error may be the error occurring at one end of the interval. In the example of the function 1/x, the error at 1.0 for an unmodified two term Taylor series approximation is about 0.111 at x=1.0 and about 0.0556 at x=2.0. However, selecting a at the center of the interval may permit the x−a generation to be simply the complement delta circuit 60.

In another embodiment, an optimization to the two term Taylor series may be implemented such that the error at each end of the interval is equal (or approximately equal, within the error ranges of the series-approximated component 16). One mechanism to provide approximately equal error at each end is to adjust the f'(a) term to be the average slope (i.e. the average first derivative f'(a)) of the function over the interval. In the case of the function 1/x, this slope may be −0.5 and a may be the square root of 2 (e.g. about 1.414). The maximum error size may be reduced, since the maximum error may be reduced at one end of the interval while increasing at the other end (which did not have the maximum error in the embodiment of FIG. 7). Such an embodiment is illustrated graphically in FIG. 8, with the dashed line 84, for the function 1/x. The maximum error on each end may be about 0.086. In order to continue the use of a at the midpoint of the interval, f(a) may be reevaluated on the optimized line with the average slope.

It is noted that a may be selected differently in other embodiments. In such embodiments, a full adder may be used in place of the complement delta circuit 60, increasing the size of the x−a generation circuitry.

Figure 9:
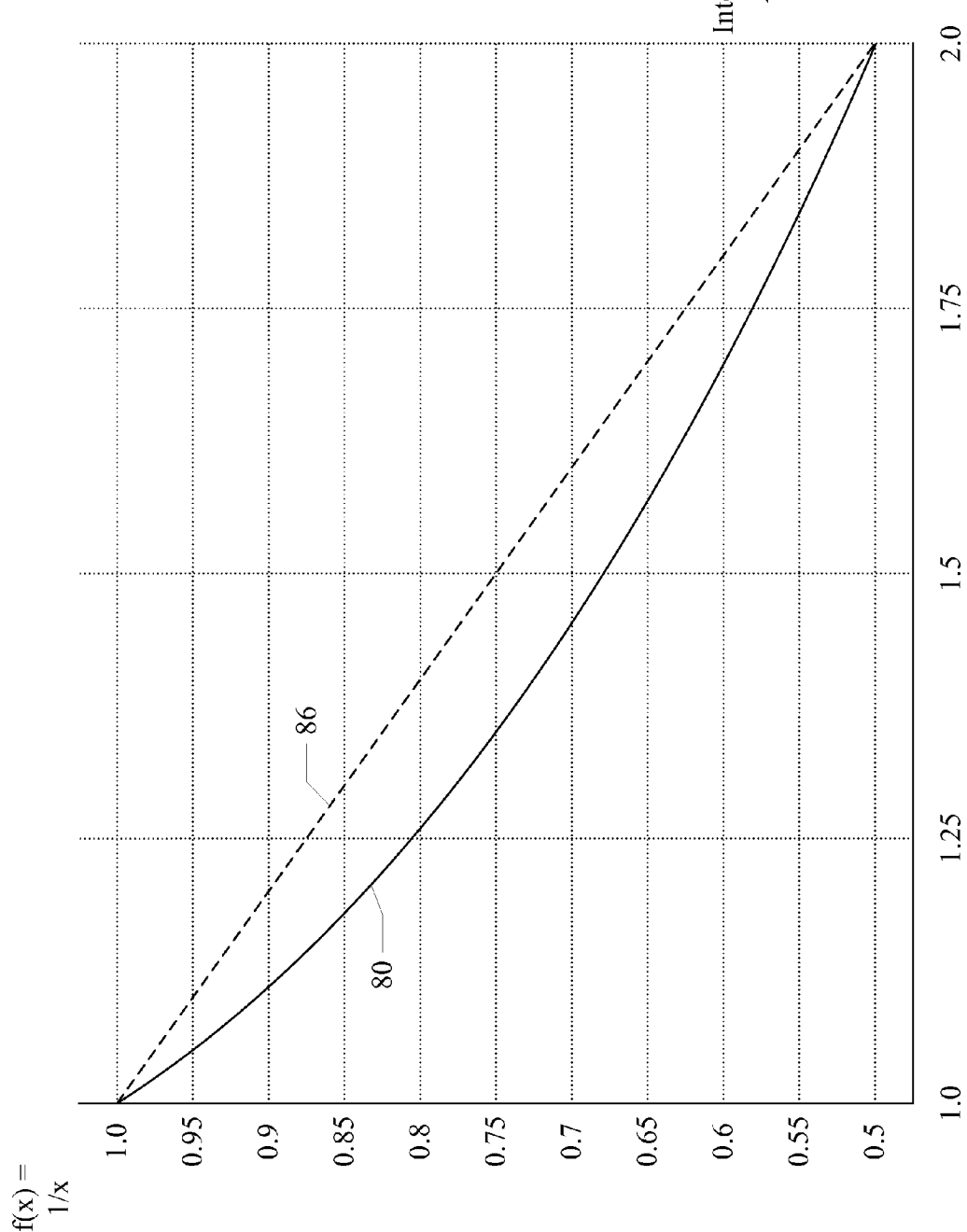
FIG. 9 is a diagram of one embodiment of a linear interpolation approximation of the first derivate term.

FIG. 9 illustrates the use of a linear interpolation approximation according to one embodiment. The linear interpolation approximation may be defined as connecting the interval end points of the series-approximated function with a line (e.g. the line 86 in FIG. 9). Accordingly, for the one interval example, the minimum error (zero) is at the end points x=1.0 and 2.0 and the maximum error may occur near the center. For the 1/x example of FIG. 9, the maximum error may occur at x=square root of 2, and may be about 0.086. If the linear interpolation approximation is implemented, the slope of the line 86 may be the f'(a) output from the LUT 54 for each interval.

Alternatively, the stored values of f(a) may be used to calculate the slope f'(a) for an interval. In such an embodiment, the f(a) terms are stored for the ends of each interval, and two consecutive terms may be read from the LUT 54 for a given interval. In an embodiment, the LUT 54 may be divided into even and odd portions to avoid adding a second read port to the LUT 54. One f(a) term may be read from the even portion and the other from the odd portion. An adder may be used to compute the slope (f'(a)) term into the multiplier 58 from the two f(a) terms. The x−a term may be calculated from the end points of the interval (e.g. from the closer end point to a given input value x), rather than the center. A multiplexor may be added to select which of the end point values is used as f(a).

Figure 10:
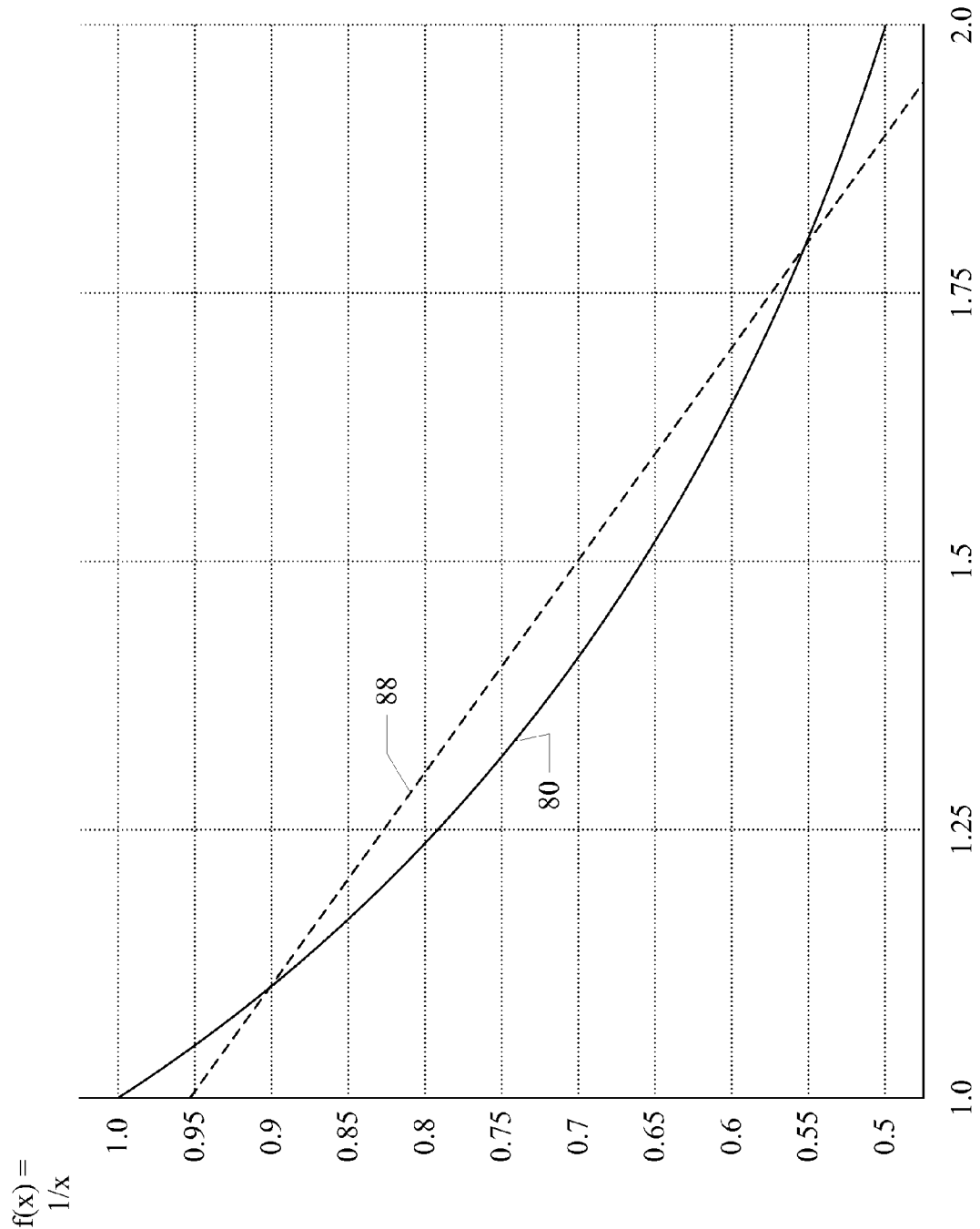
FIG. 10 is a diagram of a modified Taylor series expansion that merges a result of the linear interpolation approximation with the Taylor series expansion.

FIG. 10 illustrates yet another embodiment of an approximation of the 1/x function. In this embodiment, the combination of the two term Taylor series approximation (e.g. either embodiment described above with regard to FIG. 7 or FIG. 8) and the linear interpolation approximation of FIG. 9. The embodiment of FIG. 10 may be referred to as a "median fit" herein. The median fit may be generated by averaging one of the Taylor series approximations with the linear interpolation approximation. More particularly, in one embodiment, the average may be a geometric average. The result of the averaging is illustrated for the one interval example in FIG. 10. If multiple intervals are used, the intervals may be averaged individually to produce the LUT values for the intervals. The resulting approximation is illustrated by the dashed line 88 in FIG. 10.

For the median fit, the maximum error may occur at three points, but may be less than the maximum error of the previous embodiments. Specifically, the maximum error may be at the end points and near the middle (e.g. at x=square root of 2 in the case of 1/x as illustrated in FIG. 10). The maximum error may be about 0.043 in this example.

Figure 11:
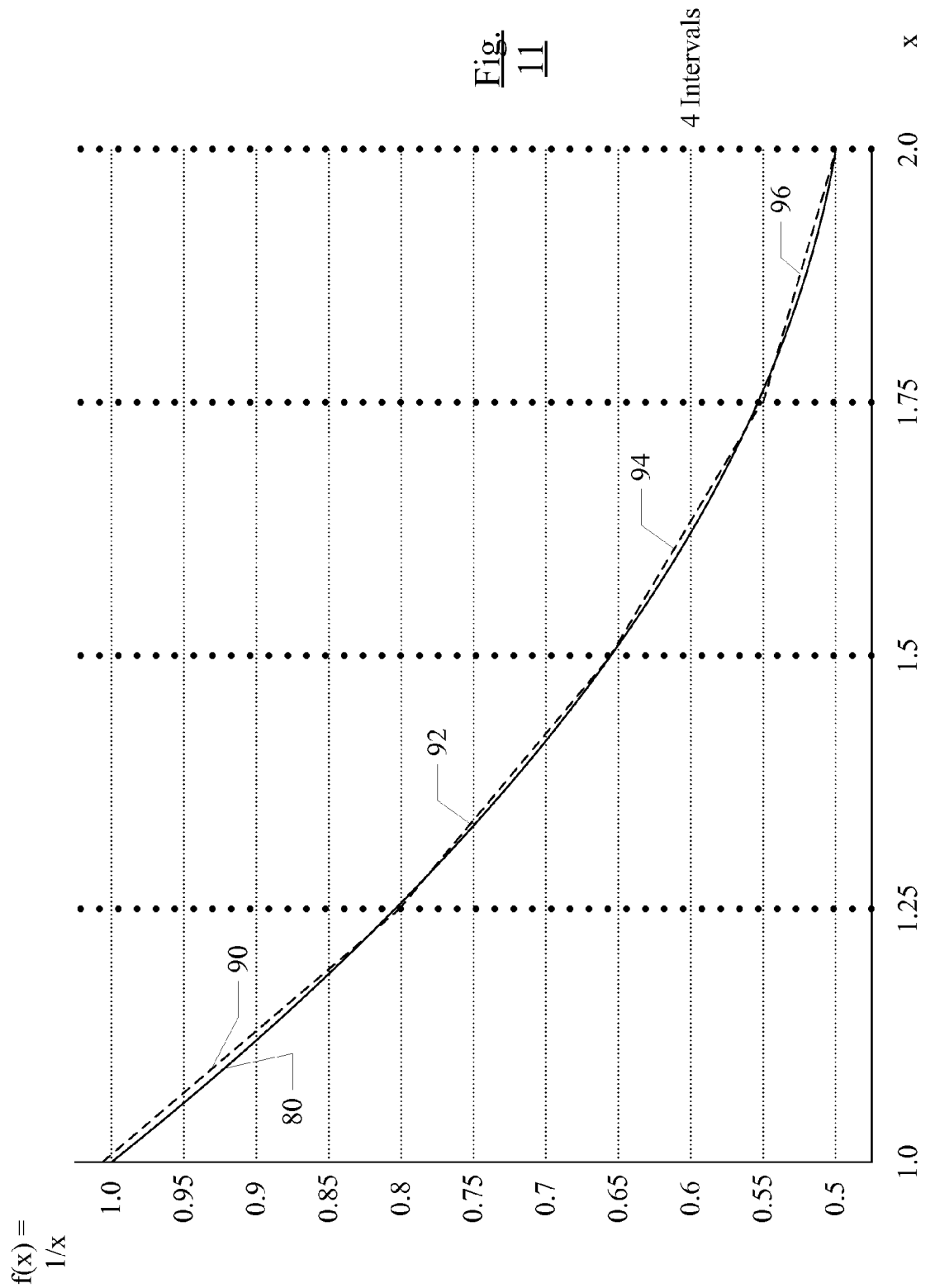
FIG. 11 is a diagram of one embodiment of the modified Taylor series using additional intervals.

FIG. 11 is a diagram illustrating the approximation when 4 intervals are used. The intervals are delimited in FIG. 11 by heavy vertical dotted lines at x=1.25, 1.5, 1.75, and 2.0. Within each interval, any of the embodiments of FIGS. 7-10 may be used. Thus, there are 4 dashed lines 90, 92, 94, and 96 illustrating the approximation within each interval. Comparing FIG. 11 to FIGS. 7-10, it is clear that the error may be reduced significantly through the use of additional intervals. Accordingly, a balance may be struck between the complexity of the approximation at each interval and the number of intervals used.

Figure 12:
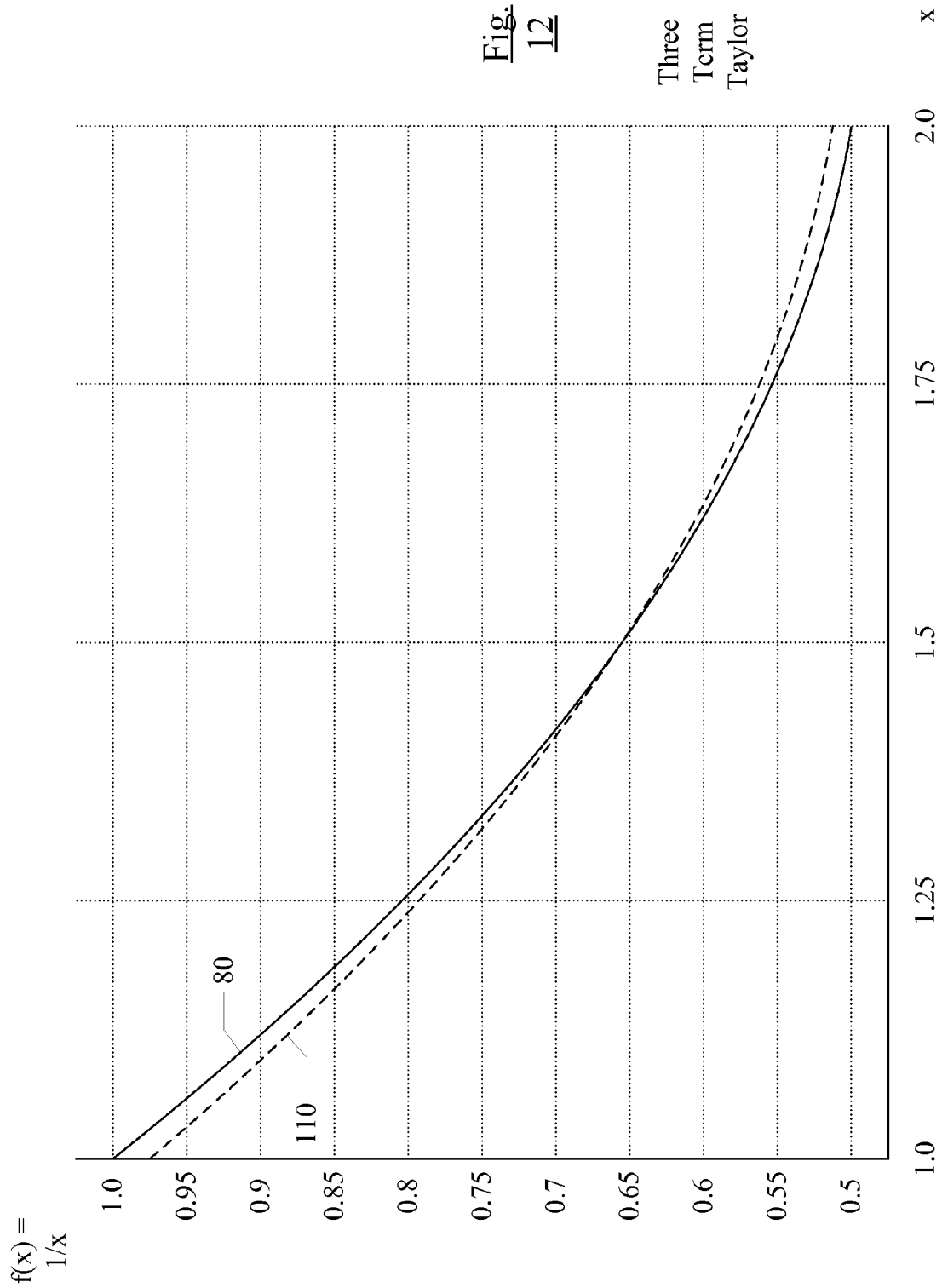
FIG. 12 is a diagram of one embodiment of a Taylor series expansion that uses three initial terms of the series.

FIG. 12 is an example of a three term Taylor series approximation using a single interval, for an embodiment. Adding the second derivative term to the approximation may generally have the effect of "bending" the approximation on both sides of a, bringing the approximation closer to the curve on both sides. The approximation based on the initial three terms is illustrated FIG. 12 as the curve 110. As can be seen in FIG. 12, the error in the three term approximation is greatest at the endpoints.

Figure 13:
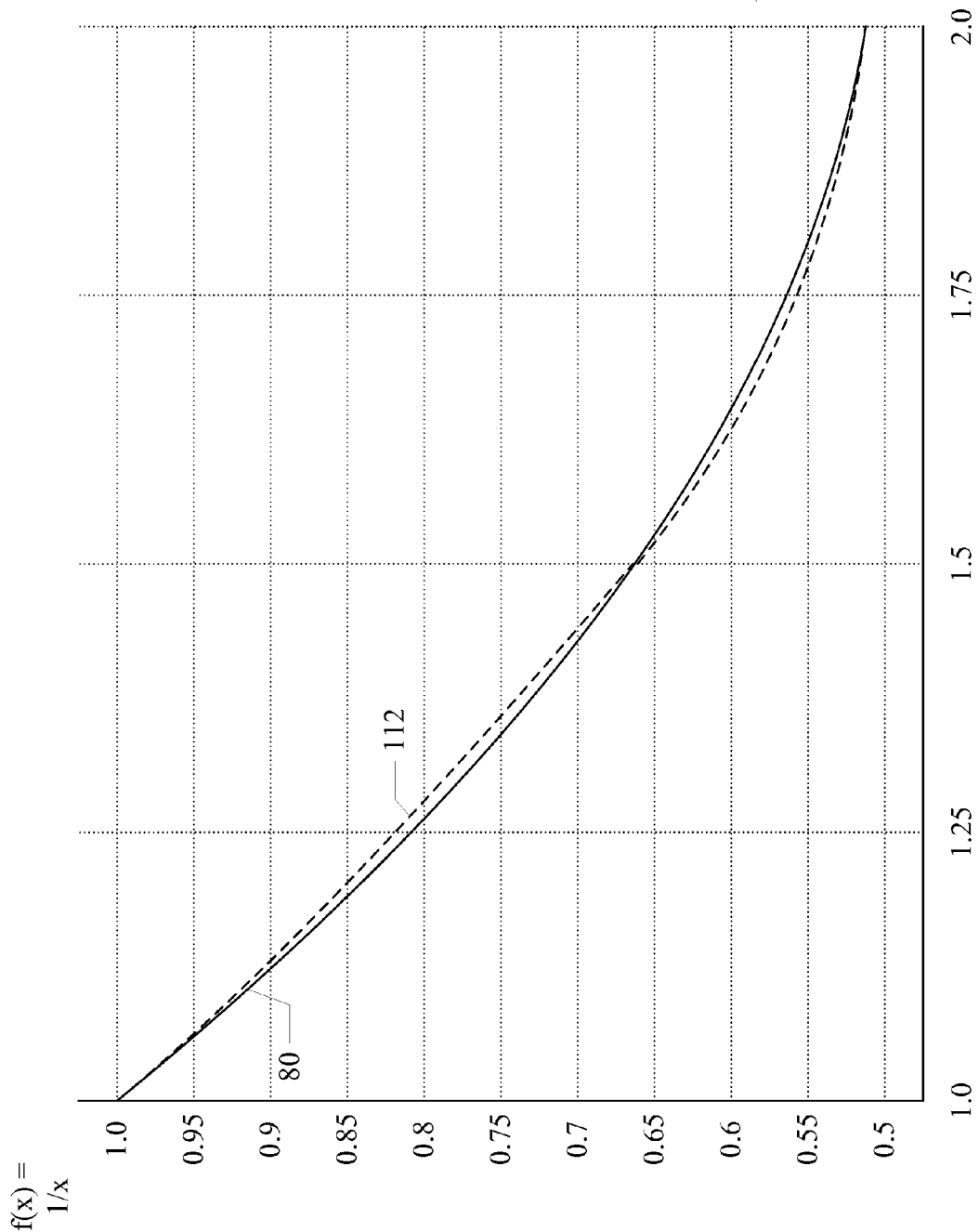
FIG. 13 is a diagram of another embodiment of a modified Taylor series expansion based on the three initial terms of the series.

An improved three term Taylor series approximation may be generated. For example, one improvement is illustrated in FIG. 13 with the curve 112. This approximation reduces the error to approximately zero at the end points of the intervals. In an embodiment, the approximation of FIG. 13 may involve using the average slope over the interval as the f'(a) term (similar to the two term optimization of FIG. 8). Assuming an f''(a) term equal to zero, an error can be calculated at one of the end points (e.g. the 1.0 endpoint). Then, the error may be set equal to the third term of the Taylor series and f"(a) may be solved to generate the improved three term Taylor series approximation. In one embodiment, the f"(a) term may be 0.66667 and the error may be reduced to about −0.01336 (minimum) and 0.009 (maximum). An optimized solution with equal minimum and maximum errors of +/−0.00736 has been determined by trial and error for the 1/x example. The optimized solution includes f(a) of 0.66422, f'(a) of −0.48531, and f"(a) of 0.68612.

Figure 14:
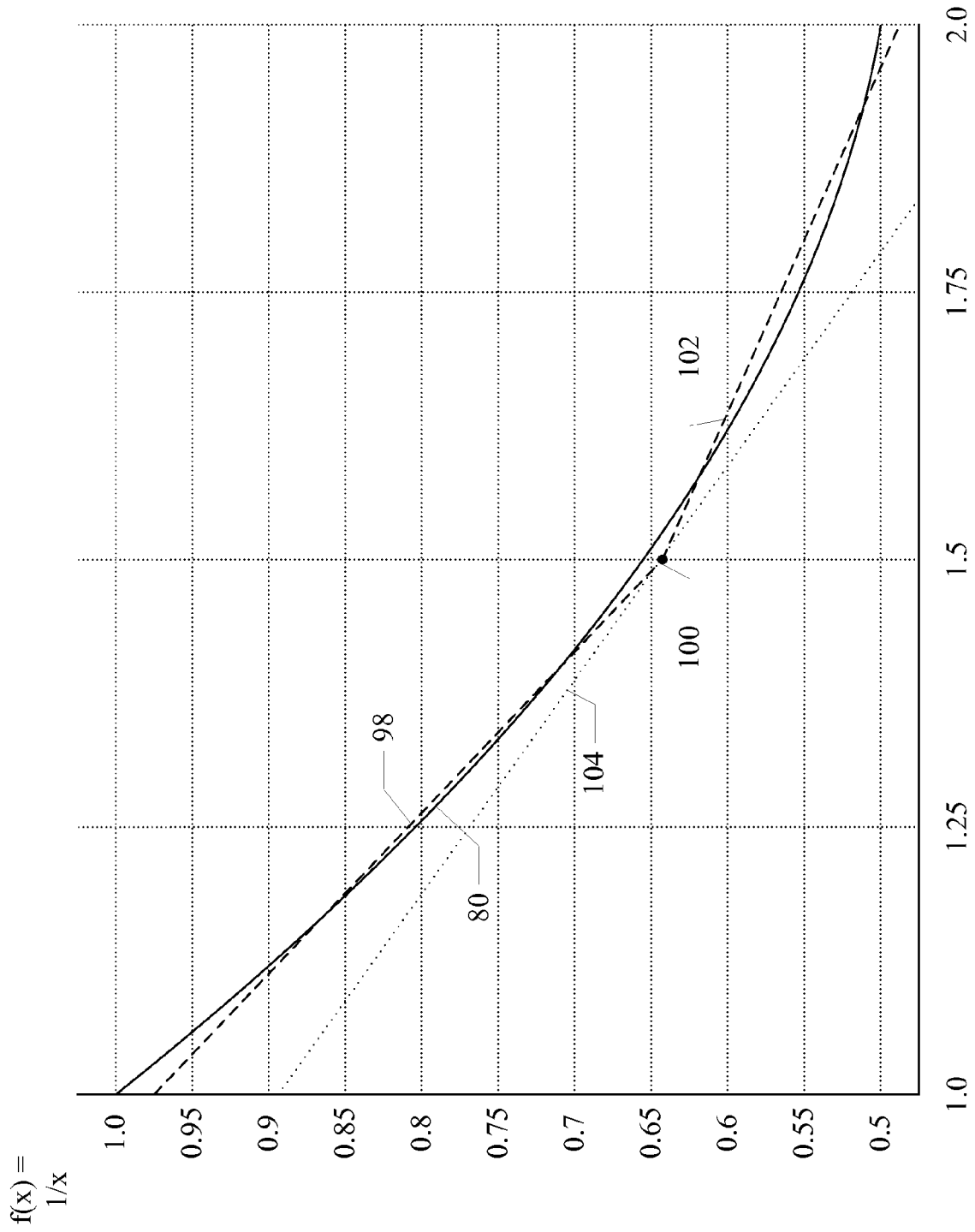
FIG. 14 is a diagram of a VFit approximation to the three term Taylor series.

Finding optimized three term Taylor series approximations for a generalized function (and multiple intervals) may be a computational intensive, trial-and-error task. One method for approximating the three term Taylor series shown in FIG. 12 is to perform a "Vfit" as described herein. The Vfit uses the same hardware as the two-term Taylor series, along with an additional adder to generate the correct f'(a) term from the f'(a) term stored in the LUT 54 and the f"(a) term stored in the LUT 54. Specifically, in the steeper subinterval the f"(a) term from the LUT 54 used to make the f'(a) term from the LUT 54 steeper, and the f"(a) term from the LUT 54 is used to make the f'(a) term from the LUT 54 shallower. The Vfit is illustrated for one embodiment in FIG. 14. In the Vfit process, the interval may be treated as two sub intervals, one beginning at one end point of the interval and ending at a, the other beginning at a and ending at the other endpoint of the interval. A simplified version of the Vfit is shown in FIG. 14, selecting a at the center of the interval. A median fit may be performed on one subinterval (e.g. the dashed line 98 in FIG. 14). More particularly, the median fit may be performed on the subinterval having the larger second derivative. The median fit for the subinterval terminates at an end point in the center (at a) that is not on the function curve 80. The end point is illustrated as the point 100 in FIG. 14. For the other subinterval, a pseudo-median fit line may be constructed (line 102 in FIG. 14). In one embodiment, the line 102 may be constructed by: (1) finding a point f(t) on the curve 80, where f(t) is the point at which a line passing through the point 100 and proceeding to the interval boundary would be tangent to the curve 80; and (2) constructing the pseudo-median fit line having the property that the vertical distance between the curve 80 and the line at t is equal to the vertical distance between the line and the curve 80 at the end point of the interval. Finally, the f'(a) value for the interval may be the slope of a line that passes through the point 100 and that is equally distant in both sign and magnitude from the median line 98 and the pseudo-median line 102 at the interval edges (e.g. the line 104 in FIG. 14).

The LUTs 54 and 70 may be filled based on the approximation shown in FIG. 14 as follows. The f(a) value may be the point 100; the f'(a) value may be the slope of the line 104, and the f"(a) value may be a positive or negative value that may be added to the f'(a) value to produce the slope of the lines 98 and 102 in FIG. 14 for each of the subintervals. In one embodiment, the result for the example of 1/x may be f(a)=0.64983 (at a=1.5), f'(a)=−0.48583, and f"(a)=0.18084 (so that f'(x)=−0.66667 in the steeper subinterval and f'(x)=−0.30500 in the shallower subinterval).

In another embodiment, a more optimized Vfit may be used in which a median fit line is generate for each subinterval, and a is selected as the point at which the two median fit lines cross. Then f'(a) is calculated as the slope of the line that passes through the cross point and is equally distant in both sign and magnitude from the median lines for each subinterval at the interval edges. In an embodiment, the result for the 1/x example may be a=1.37258, f(a)=0.71783, f'(a)=−0.54642, and f"(a)=0.18214 (so f'(a)=−0.72855 in the steeper subinterval and f'(a)=−0.36428 in the shallower subinterval).

Figure 15:
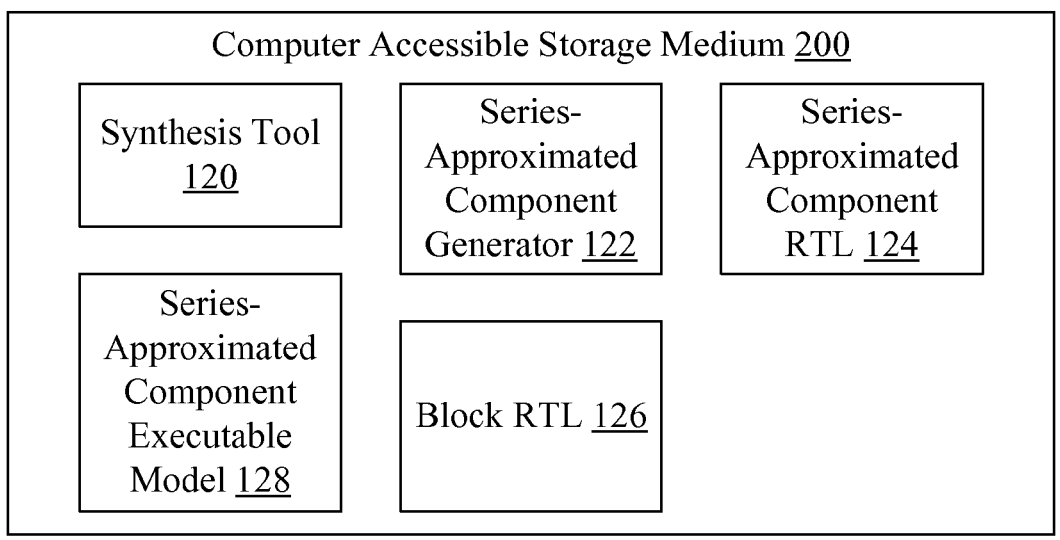
FIG. 15 is a block diagram of one embodiment of a computer accessible storage medium.

Turning now to FIG. 15, a block diagram of one embodiment of a computer accessible storage medium 200 is shown. Generally speaking, a computer accessible storage medium may include any storage media accessible by a computer during use to provide instructions and/or data to the computer. For example, a computer accessible storage medium may include storage media such as magnetic or optical media, e.g., disk (fixed or removable), tape, CD-ROM, DVD-ROM, CD-R, CD-RW, DVD-R, DVD-RW, or Blu-Ray. Storage media may further include volatile or non-volatile memory media such as RAM (e.g. synchronous dynamic RAM (SDRAM), Rambus DRAM (RDRAM), static RAM (SRAM), etc.), ROM, or Flash memory. The storage media may be physically included within the computer to which the storage media provides instructions/data. Alternatively, the storage media may be connected to the computer. For example, the storage media may be connected to the computer over a network or wireless link, such as network attached storage. The storage media may be connected through a peripheral interface such as the Universal Serial Bus (USB).

The computer accessible storage medium 200 in FIG. 15 may store one or more of a synthesis tool 120, a series-approximated component generator 122, series-approximated component RTL 124, block RTL 126, and/or series-approximated component executable model(s) 128. The synthesis tool 120 may include instructions which, when executed on a computer, implement the operation described here for the synthesis tool. In one embodiment, the synthesis tool 120 may be an commercially available tool such as those available from Synopsys Inc., Cadence Design Systems, Inc., etc. Similarly, the series-approximated component generator 122 may include instructions which, when executed on a computer, implement the operation described herein for the series-approximated component generator. The series-approximated component RTL 124 may include RTL descriptions of various series-approximated component embodiments. The block RTL 126 may include RTL descriptions of various blocks that may instantiate series-approximated components, non-series-approximated components, and/or other blocks. The series-approximated component executable model 128 may include executable models corresponding to the series-approximated component RTL 124. A carrier medium may include computer accessible storage media as well as transmission media such as wired or wireless transmission.

A methodology for developing a library of series-approximated components is provided to aid designers in efficiently implementing series-approximated functions in hardware. Synthesis tools may synthesize the LUTs and multiply-add circuits of the series-approximated components (e.g. see FIGS. 4 and 6) using an underlying cell library of components, attempting to produce efficient net list implementations. However, there may be significant variations from version to version of the synthesis tools, from vendor to vendor of the synthesis tools, and from cell library to cell library. Accordingly, having a resynthesizable version of the components (e.g. the RTL 124) may be desired for regenerating the library if versions or vendors of the synthesis tool are changed. That is, the choice that is smallest (in terms of area occupied by the resulting component after synthesis) and which meets the accuracy requirements of the integrated circuit 10 may be different depending on the version/vendor of the synthesis tool.

Figure 16:
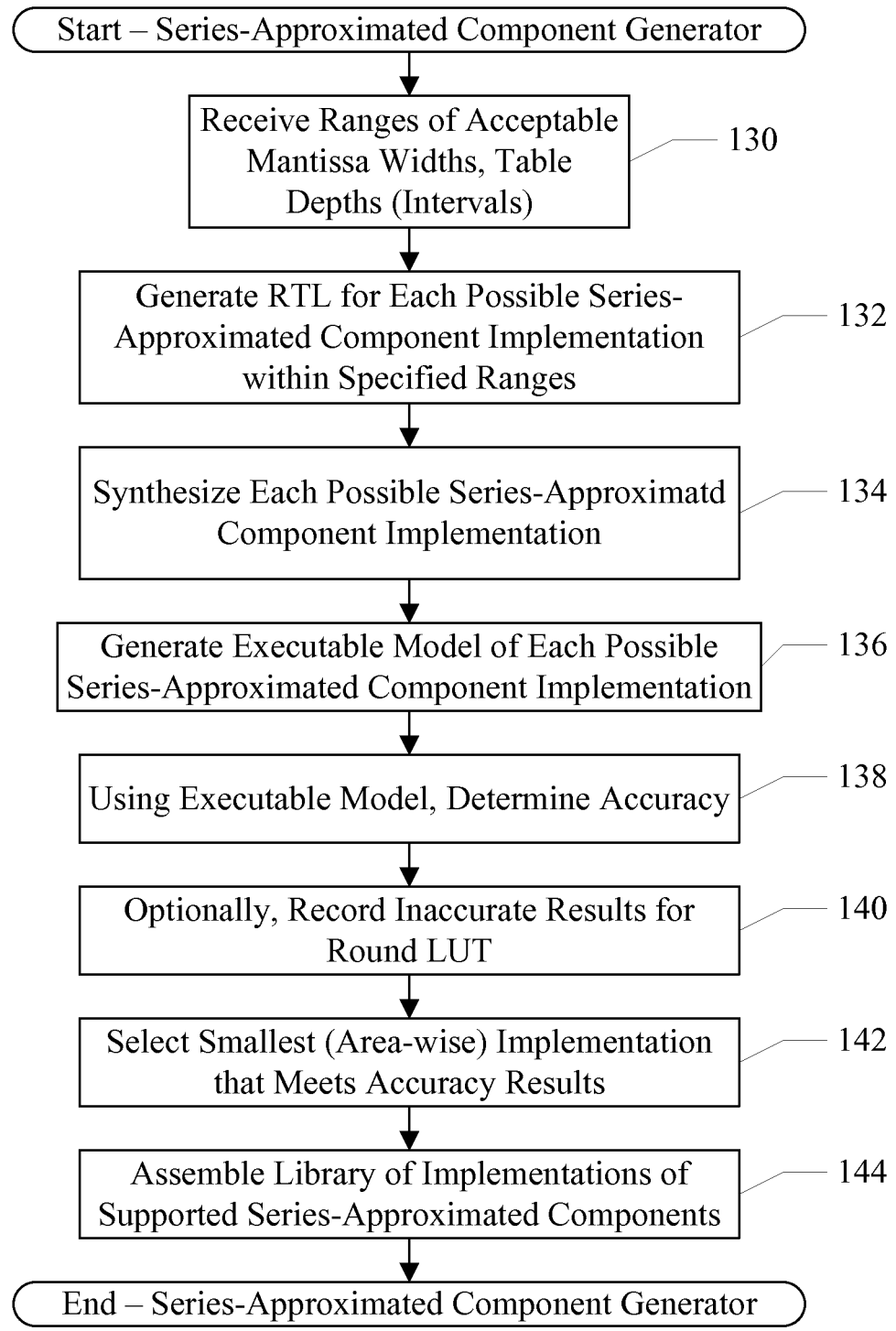
FIG. 16 is a flowchart illustrating one embodiment of building a library of transcendental function implementations.

The series-approximated component generator 122 may be configured to generate the series-approximated component RTL 124 and the series-approximated component executable model 128 for each possible implementation within input guidelines set by a user. FIG. 16 is a flowchart illustrating operation of one embodiment of the series-approximated component generator 122. While the blocks are shown in a particular order for ease of understanding, other orders may be used. The series-approximated component generator 122 may include instructions which, when executed on a computer, implement the operation shown in FIG. 16 on the computer.

The series-approximated component generator 122 may be configured to receive ranges of acceptable input parameters describing the series-approximated component (block 130). The input parameters may include a range of acceptable mantissa widths and/or lookup table depths (intervals), for example. Widths of the LUT outputs (f(a), f'(a), and f"(a)) may be the input parameter width, or may be directly varied by parameters as well. The parameters may further include the transcendental/non-linear function to be implemented. In some embodiments, the parameters may further specify which series expansions are permissible (e.g. median, linear interpolation, Taylor, two term, three term, etc.). The parameters may be provided to the series-approximated component generator 122 in any desired fashion. For example, a user may directly input, using one or more input devices, the parameters. The parameters may also be stored in a parameter file. The user may elect to define ranges that include implementations that the user believes will not meet requirements, to ensure the coverage of the methodology.

That is, if at least some unworkable options are attempted, one may be able to have some confidence that many of the workable solutions have been generated and analyzed in the methodology.

The series-approximated component generator 122 may generate series-approximated component RTL for each possible series-approximated component implementation within the specified ranges (block 132). Each implementation may be stored in its own RTL file, for example. The set of generated implementations may be exhaustive within the specified limits.

The series-approximated component generator 122 may invoke the synthesis tool 120 to synthesize each implementation (block 134). In some embodiments, the series-approximated component generator 122 may generate an executable model of each implementation as well (block 136). The executable model may be expressed in a high level programming language such as C or C++, and may be compiled to executable code. Generally, the executable model may mimic the operation of the circuitry described in the corresponding series-approximated component generator 122, producing the same result for the same input operand. The executable model may be used for verification purposes, e.g., with executable code corresponding to other components of the integrated circuit. In one embodiment, the executable model may include a lookup table of results for each possible input, and code that reads the table responsive to an input operand. In another embodiment, the executable code may include code that calculates the result according to the implementation.

The series-approximated component generator 122 may invoke the executable model and exercise the model over each possible input (block 138). The series-approximated component generator 122 may compare the result from the model to the correct result (either an IEEE accurate result, or a result within 1 ULP accuracy, depending on whether or not an IEEE accurate result is desired). The model may produce the correct results (in addition to the results corresponding to the RTL implementation) and may make the comparison. Alternatively, the series-approximated component generator 122 may produce the correct results and make the comparison. Optionally, if the round LUT 62 is going to be used, the series-approximated component generator 122 may generate the LUT 62 by noting which inputs produced inaccurate results and the value of the inaccuracy (block 140). The values (or, more particularly, the negative of the inaccuracy) may be stored in the LUT 62 to correct the inaccuracy.

Once the synthesis and accuracy determination are complete for each implementation (blocks 136 and 138 are complete), the series-approximated component generator 122 may compare the area occupied by the synthesized results of each implementation, and may select the smallest-area implementation that meets the accuracy requirements for the series-approximated component (block 142). Area may be determined by placing and routing the netlist that is provided by synthesis. Alternatively, area may be estimated from the gates, custom circuits, and/or standard cells that are called out in the netlist along with the relative sizes of those various circuits. The selected implementation may be added to a library of implementations that may be made available to block designers for instantiation in their blocks (block 144).

Numerous variations and modifications will become apparent to those skilled in the art once the above disclosure is fully appreciated. It is intended that the following claims be interpreted to embrace all such variations and modifications.

What is claimed is:

1. A method comprising:
   receiving a range of parameters for a function to be implemented in an integrated circuit;
   invoking a synthesis tool on a computer to synthesize each possible implementation of the function within the range of parameters, wherein the possible implementations are based on a Taylor series expansion of the function, wherein each possible implementation includes values for the function at selected points and values of one or more derivatives of the function at the selected points, and wherein the derivative values are modified to generate modified values for the possible implementations to reduce a maximum error in the possible implementations, wherein the selected points are points at which a first derivative of the function is an average of the first derivative over an interval around the selected point;
   analyzing a synthesis result for each possible implementation on the computer; and
   selecting a smallest-area implementation from among the possible implementations responsive to the analyzing on the computer.

2. The method as recited in claim 1 further comprising:
   generating an executable model of each possible implementation of the function on the computer;
   executing the executable models on the computer to determine which possible implementations meet an accuracy requirement for the function; and
   wherein the selecting is further responsive to the executing, and wherein a selected implementation is the smallest-area implementation that also meets the accuracy requirement.

3. A method comprising:
   receiving a range of parameters for a function to be implemented in an integrated circuit;
   invoking a synthesis tool on a computer to synthesize each possible implementation of the function within the range of parameters;
   analyzing a synthesis result for each possible implementation on the computer;

selecting a smallest-area implementation from among the possible implementations responsive to the analyzing on the computer;

generating an executable model of each possible implementation of the function on the computer;

executing the executable models on the computer to determine which possible implementations meet an accuracy requirement for the function;

during the executing, logging which results from the executable model are inaccurate and a direction of the inaccuracy, wherein the executing is performed over each possible input operand value; and modifying the corresponding implementation on the computer to include a rounding table to correct the inaccuracies.

4. The method as recited in claim 1 wherein the parameters include an input width of an input operand to the function.

5. The method as recited in claim 1 wherein the parameters include a table depth for a table storing series expansion values including the modified values.

6. The method as recited in claim 1 further comprising generating a register-transfer level (RTL) representation of each possible implementation and providing the RTL representation to the synthesis tool.

7. The method as recited in claim 6 further comprising including the RTL representation of the selected implementation in a library available to integrated circuit designers.

8. A non-transitory computer accessible storage medium storing a plurality of instructions executable on a computer to:

generate a plurality of implementations derived from a Taylor series-approximation of a function implemented by a component of an integrated circuit, wherein each of the plurality of implementations includes values for the function at selected points and values of one or more derivatives of the function at the selected points, and wherein the derivative values are modified to generate modified values for the plurality of implementations to reduce a maximum error in the plurality of implementations, wherein the selected points are points at which a first derivative of the function is an average of the first derivative over an interval around the selected point;

synthesize the plurality of implementations; and select a first implementation for which a synthesis result is smallest among the plurality of implementations in integrated circuit area.

9. The non-transitory computer accessible storage medium as recited in claim 8 wherein each of the plurality of implementations comprise a lookup table storing at least the values for the function at the selected points and the modified values at the selected points, and wherein at least some of the plurality of implementations vary a number of entries in the table.

10. The non-transitory computer accessible storage medium as recited in claim 8 wherein the plurality of instructions are further executable to:

generate an executable model of each of the plurality of implementations;

execute the executable model over all input operands for the corresponding implementation of the plurality of implementations; and determine an accuracy of the corresponding implementation responsive to executing the executable model.

11. The non-transitory computer accessible storage medium as recited in claim 10 wherein the plurality of instructions are further executable to:

record inaccuracies detected in executing the executable model;

generate a table of the recorded inaccuracies; and include the table in the corresponding implementation to correct the recorded inaccuracies.

12. The non-transitory computer accessible storage medium as recited in claim 8 wherein the selected points are selected to cause the maximum error among two or more points to be equal.

13. The non-transitory computer accessible storage medium as recited in claim 8 wherein a geometric average of a first derivative of the function and a linear interpolation of the function is used as the modified value at each selected point.

14. The non-transitory computer accessible storage medium as recited in claim 8 wherein the modified values are generated according to a Vfit algorithm.

15. A non-transitory computer accessible storage medium storing a plurality of instructions executable on a computer to:

generate a plurality of register-transfer level (RTL) representations derived from a Taylor series approximation of a function implemented by a component of an integrated circuit, wherein each of the plurality of RTL representations includes values for the function at selected points and values of one or more derivatives of the function at the selected points, and wherein the derivative values are modified to generate modified values for the plurality of RTL representations to reduce a maximum error in the plurality of RTL representations, wherein each of the plurality of RTL representations is a different implementation of the component, wherein the selected points are points at which a first derivative of the function is an average of the first derivative over an interval around the selected point;

invoke a synthesis tool to synthesize the plurality of RTL representations;

analyze results from the synthesis tool to identify one of the plurality of RTL representations synthesizes to a circuit that occupies a smallest amount of integrated circuit area among the plurality of RTL implementations representations; and publish the one of the plurality of RTL representations as a library element for the component in the integrated circuit.

16. The non-transitory computer accessible storage medium as recited in claim 15 wherein the plurality of instructions are further executable to receive a plurality of parameter ranges describing acceptable implementations of the component, wherein generating the responsive to the parameter ranges.

17. The non-transitory computer accessible storage medium as recited in claim 16 wherein the plurality of parameter ranges include ranges of input operand widths.

18. The non-transitory computer accessible storage medium as recited in claim 16 wherein the plurality of RTL representations each include a table with for the values and the modified values at the selected points, and wherein the plurality of parameter ranges include ranges of the values.

19. The non-transitory computer accessible storage medium as recited in claim 17 wherein a depth of the table is one of the plurality of parameter ranges.

* * * * *

UNITED STATES PATENT AND TRADEMARK OFFICE
CERTIFICATE OF CORRECTION

PATENT NO.        : 8,504,954 B1                                          Page 1 of 1
APPLICATION NO.   : 13/435930
DATED             : August 6, 2013
INVENTOR(S)       : Vaughn T. Arnold It is certified that error appears in the above-identified patent and that said Letters Patent is hereby corrected as shown below:

In the Claims:

Claim 15, Column 16, Line 43, please delete "implementations representations; and" and substitute
-- representations; and --

Signed and Sealed this
Twenty-eighth Day of January, 2014

Michelle K. Lee
*Deputy Director of the United States Patent and Trademark Office*